United States Patent
Chang et al.

(10) Patent No.: US 9,902,137 B2
(45) Date of Patent: Feb. 27, 2018

(54) THIN METAL SUBSTRATE HAVING HIGH THERMAL CONDUCTIVITY

(75) Inventors: Meng Hao Chang, Taiwan (TW); Chien Hui Lee, Taiwan (TW); J. King Chen, Taiwan (TW)

(73) Assignee: AISA ELECTRONIC MATERIAL CO., LTD, Hsinchu County (TW)

( * ) Notice: Subject to any disclaimer, the term of this patent is extended or adjusted under 35 U.S.C. 154(b) by 1722 days.

(21) Appl. No.: 13/438,099

(22) Filed: Apr. 3, 2012

(65) Prior Publication Data

US 2013/0040120 A1 Feb. 14, 2013

(30) Foreign Application Priority Data

Aug. 9, 2011 (TW) .............................. 100216334 U

(51) Int. Cl.
| | | |
|---|---|---|
| *B32B 7/02* | (2006.01) | |
| *B32B 5/16* | (2006.01) | |
| *B32B 3/00* | (2006.01) | |
| *B32B 7/12* | (2006.01) | |
| *B32B 15/088* | (2006.01) | |
| *H01L 33/64* | (2010.01) | |
| *B32B 15/20* | (2006.01) | |
| *B32B 27/20* | (2006.01) | |

(52) U.S. Cl.
CPC .............. *B32B 15/088* (2013.01); *B32B 7/12* (2013.01); *B32B 15/20* (2013.01); *B32B 27/20* (2013.01); *H01L 33/641* (2013.01); *B32B 2307/302* (2013.01); *Y10T 428/24975* (2015.01); *Y10T 428/25* (2015.01); *Y10T 428/26* (2015.01); *Y10T 428/2848* (2015.01)

(58) Field of Classification Search
USPC ................................ 428/216, 354, 323, 332
See application file for complete search history.

(56) References Cited

U.S. PATENT DOCUMENTS

| | | | | |
|---|---|---|---|---|
| 5,304,418 | A * | 4/1994 | Akada .................... | H01L 21/302 257/E21.214 |
| 5,545,473 | A * | 8/1996 | Ameen ............... | H01L 23/3737 257/E23.107 |
| 5,591,034 | A * | 1/1997 | Ameen ............... | H01L 23/3737 257/E23.107 |
| 7,927,501 | B2 * | 4/2011 | Komuro .................... | B22F 3/26 148/101 |
| 8,377,557 | B2 * | 2/2013 | Ozawa .................... | F28F 13/00 428/323 |
| 2008/0289860 | A1 * | 11/2008 | Kita et al. ....................... | 174/254 |
| 2009/0095517 | A1 * | 4/2009 | Nonaka et al. ................ | 174/259 |
| 2011/0114371 | A1 * | 5/2011 | Lin et al. ........................ | 174/254 |

\* cited by examiner

*Primary Examiner* — Tahseen N Khan
(74) *Attorney, Agent, or Firm* — Amin, Turocy & Watson, LLP

(57) ABSTRACT

A thin metal substrate having high thermal conductivity includes a copper foil layer, an insulating polymer layer and a thermal conductive adhesive layer. The thermal conductive adhesive layer has a resin and a thermal conductive powder dispersed in the resin. The insulating polymer layer is disposed between the copper foil layer and the thermal conductive adhesive layer. Since the thermal conductive adhesive layer has the thermal conductive powder and the insulating polymer layer has insulating and anti-breakdown abilities, the substrate has a reduced thickness, high heat dissipating efficiency and improved insulating performance.

8 Claims, 1 Drawing Sheet

THIN METAL SUBSTRATE HAVING HIGH THERMAL CONDUCTIVITY

BACKGROUND OF THE INVENTION

1. Field of the Invention

The present invention relates to flexible substrates applicable to LED products, and, more particularly, to a thin metal substrate having high thermal conductivity.

2. Description of Related Art

Although LED products have advantages of energy-saving, high efficiency, fast response time and long lifetime, and do not contain mercury that is harmful to the environment, the LED products convert only about 20% of input power into light, with the remaining being converted into heat.

If heat generated by an LED product cannot be timely dissipated out, it can result in a too high junction temperature, thus adversely affecting the lifetime, light emitting efficiency and stability of the LED.

Generally, a conventional thermal conductive adhesive that is attached to a copper layer has a thickness of 60-120 um for meeting insulating requirements. This increases the overall thickness of the product and leads to an undesirable heat dissipating effect. In view of these drawbacks, a heat dissipating model of TPI (thermoplastic polyimide) mixed with a thermal conductive powder is used to reduce the overall thickness of the product and achieve a preferred insulating characteristic. However, TPI needs to be processed at a high temperature greater than 350° C., which significantly increases the processing cost and is not suitable for mass production.

Taiwan Patent No. M377823 discloses a composite double-sided copper-clad substrate. But the heat dissipating efficiency and insulating performance of the substrate need to be improved.

SUMMARY OF THE INVENTION

Accordingly, the present invention provides a thin metal substrate having high thermal conductivity so as to reduce thickness, increase heat dissipating efficiency and improve anti-breakdown ability.

In view of the above and other objects, the present invention provides a thin metal substrate having high thermal conductivity, which comprises a copper foil layer, a thermal conductive adhesive layer comprising a resin and a thermal conductive powder dispersed in the resin, and an insulating polymer layer disposed between the copper foil layer and the thermal conductive adhesive layer.

In an embodiment, the thermal conductive powder is 40-90% by weight in a solid content of the thermal conductive adhesive layer.

In an embodiment, the thermal conductive powder has an average particle diameter of 5-20 um, and the thermal conductive powder is made of at least one selected from the group consisting of silicon carbide, boron nitride, aluminum oxide and aluminum nitride.

The copper foil layer can be an electrodeposited copper foil or a rolled-wrought copper foil. Further, a circuit layer having high heat dissipating efficiency can be formed from the copper foil layer. The copper foil layer can have a thickness of 12.5-70 um. Preferably, the copper foil layer has a thickness of 35 um.

The insulating polymer layer can be made of polyimide so as to improve the anti-breakdown ability and mechanical strength of the substrate. The insulating polymer layer can have a thickness of 5-8 um.

The resin of the thermal conductive adhesive layer can be made of one selected from the group consisting of an epoxy resin, an acrylic resin, a urethane resin, a silicone resin, a poly(p-xylene) resin, a bismaleimide resin and a polyimide resin.

The thermal conductive adhesive layer can have a thickness of 20-25 um.

The substrate can further comprise a metal layer having a thickness of 0.3-3 um, and the thermal conductive adhesive layer is disposed between the insulating polymer layer and the metal layer. The metal layer can be a metal substrate such as an aluminum substrate, a copper substrate or an iron substrate.

Since the thermal conductive adhesive layer has the thermal conductive powder and the insulating polymer layer has insulating and anti-breakdown abilities, the substrate of the present invention has high heat dissipating efficiency and improved anti-breakdown performance.

DETAILED DESCRIPTION OF PREFERRED EMBODIMENTS

The following illustrative embodiments are provided to illustrate the disclosure of the present invention, these and other advantages and effects can be apparent to those in the art after reading this specification.

Figure 1:
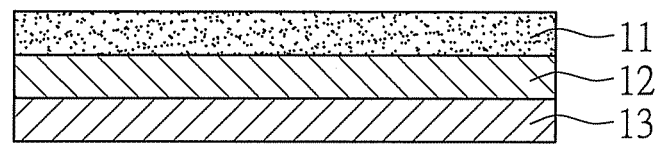
FIG. 1 is a cross-sectional view of a thin metal substrate having high thermal conductivity according to a first embodiment of the present invention.

FIG. 1 shows a thin metal substrate having high thermal conductivity according to a first embodiment of the present invention. The substrate has a copper foil layer 11, an insulating polymer layer 12 and a thermal conductive adhesive layer 13. The insulating polymer layer 12 is disposed between the copper foil layer 11 and the thermal conductive adhesive layer 13.

The copper foil layer 11 can be an electrodeposited copper foil or a rolled-wrought copper foil. The copper foil layer 11 generally has a thickness of 12.5-70 um. Preferably, the copper foil layer 11 has a thickness of 35 um.

The insulating polymer layer 12 can be made of polyimide, particularly a halogen-free thermosetting polyimide material. Preferably, the insulating polymer layer 12 is made of a self-adhesive halogen-free thermosetting polyimide material.

The thermal conductive adhesive layer 13 comprises a resin and a thermal conductive powder dispersed in the resin. The resin of the thermal conductive adhesive layer can be made of one selected from the group consisting of an epoxy resin, an acrylic resin, a urethane resin, a silicone resin, a poly(p-xylene) resin, a bismaleimide resin and a polyimide resin. The thermal conductive powder is used to improve the heat dissipating efficiency of the substrate. Generally, the thermal conductive powder has an average particle diameter of 5-20 um such that the thermal conductive adhesive layer 13 can keep a good adhesive property.

The thermal conductive powder can be made of at least one selected from the group consisting of silicon carbide, boron nitride, aluminum oxide and aluminum nitride. The thermal conductive powder is 40-90% by weight in the solid content of the thermal conductive adhesive layer 13.

In an embodiment, the thermal conductive adhesive layer 13 has a thickness of 20-25 um. In addition to the resin and the thermal conductive powder, the thermal conductive adhesive layer 13 can further comprise a curing agent, a nano-filler and so on.

Figure 2:
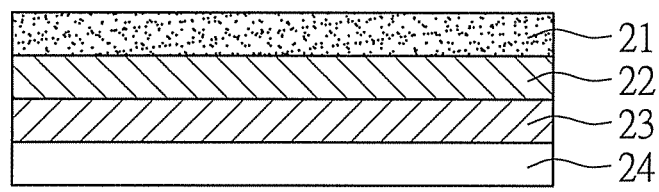
FIG. 2 is a cross-sectional view of a thin metal substrate having high thermal conductivity according to a second embodiment of the present invention.

FIG. 2 shows a second embodiment of a thin metal substrate having high thermal conductivity. The thin metal substrate has a copper foil layer 21, an insulating polymer layer 22, a thermal conductive adhesive layer 23 and a metal layer 24. The insulating polymer layer 22 is disposed between the copper layer 21 and the thermal conductive adhesive layer 23, and the thermal conductive adhesive layer 23 is disposed between the insulating polymer layer 22 and the metal layer 24.

The copper foil layer 21 can be an electrodeposited copper foil or a rolled-wrought copper foil. The copper foil layer 21 generally has a thickness of 12.5-70 um. Preferably, the copper foil layer 21 has a thickness of 35 um.

The insulating polymer layer 22 can be made of polyimide, particularly a halogen-free thermosetting polyimide material. Preferably, the insulating polymer layer 22 is made of a self-adhesive halogen-free thermosetting polyimide material.

The thermal conductive adhesive layer 23 comprises a resin and a thermal conductive powder dispersed in the resin. The thermal conductive powder is used to improve the heat dissipating efficiency of the metal substrate. Generally, the thermal conductive powder has an average particle diameter of 5-20 um and the thermal conductive adhesive layer 23 has a thickness of 20-25 um.

The thermal conductive powder can be made of at least one selected from the group consisting of silicon carbide, boron nitride, aluminum oxide and aluminum nitride. The thermal conductive powder is 40-90% by weight in the solid content of the thermal conductive adhesive layer 23.

In addition to the resin and the thermal conductive powder, the thermal conductive adhesive layer 23 can further comprise a curing agent, a nano-filler and so on.

The thermal conductive adhesive layer 23 can be attached to various kinds of metals or other materials. In an embodiment, the metal layer 24 is attached to an outer surface of the thermal conductive adhesive layer 23 and pressed and thermally cured. The metal layer 24 can be a metal substrate such as an aluminum substrate, a copper substrate or an iron substrate.

The thickness of the thermal conductive adhesive layer and insulating polymer layer can be adjusted according to requirements. Preferably, the thermal conductive adhesive layer has a thickness of 20-25 um, and the insulating polymer layer has a thickness of 5-8 um.

The present invention further provides a method of fabricating a thin metal substrate having high thermal conductivity. The method has the following steps.

An insulating polymer is coated on a copper foil layer and dried to form an insulating polymer layer, thereby obtaining a single-sided copper-clad substrate.

A thermal conductive adhesive layer is formed on the insulating polymer layer by coating or transfer printing such that the insulating polymer layer is disposed between the thermal conductive adhesive layer and the copper foil layer and the thermal conductive adhesive layer is at a semi-polymerized and semi-hardened state.

The thermal conductive adhesive layer is cured to form a thin metal substrate having high thermal conductivity.

In another embodiment, the method further has the step of attaching a metal layer to the thermal conductive adhesive layer before the thermal conductive adhesive layer is completely cured such that the thermal conductive adhesive layer is disposed between the insulating polymer layer and the metal layer, thereby forming a thin metal substrate having high thermal conductivity.

Thermal Conductivity Analysis and Test

A HotDisk thermal conductivity analyzer is used to perform thermal conductivity analysis and test to a thin metal substrate having high thermal conductivity. Two substrate samples, which are completely cured and the copper foil layers of which have been etched, are disposed at two sides of a sensor of the analyzer, and the samples and the sensor are further fastened by two steel sheets. Then, the thermal conductivity of the samples is tested through the sensor. In such a way, several groups of substrate samples are tested as experimental groups, and several groups of conventional substrates are also tested as comparison examples. The test results are shown in Table 1.

| | Thickness of Insulating polymer layer (um) | Thickness of thermal conductive adhesive layer (um) | Type of thermal conductive powder | Thermal conductivity K(W/mK) | Thermal conducting efficiency | Breakdown voltage(kv) |
|---|---|---|---|---|---|---|
| Experimental group 1 | 5 | 20 | AlN 60% | 3 | 0.12 | 3 |
| Experimental group 2 | 5 | 20 | BN 60% | 4 | 0.16 | 3 |
| Experimental group 3 | 5 | 20 | AlO 70% | 1.6 | 0.064 | 3 |
| Experimental group 4 | 5 | 20 | AlO 90% | 2.5 | 0.1 | 3 |
| Experimental group 5 | 5 | 25 | AlO 70% | 1.5 | 0.047 | 3 |
| Experimental group 6 | 8 | 20 | AlO 70% | 1.6 | 0.063 | 5 |
| Experimental group 7 | 8 | 25 | AlO 70% | 1.5 | 0.045 | 5 |
| Comparison example 1 | — | 20 | AlO 70% | 2 | 0.1 | 0.8 |
| Comparison example 2 | — | 60 | AlO 70% | 1.8 | 0.033 | 2 |
| Comparison example 3 | — | 120 | AlO 70% | 1.7 | 0.009 | 3 |
| Comparison example 4 | 20 | 20 | AlO 70% | 0.2 | 0.005 | 6 |

According to Table 1, if the thermal conductive adhesive layer has a thickness of 20-25 um and the insulating polymer layer has a thickness of 5-8 um, the overall thickness of the substrate is reduced to achieve a thermal conducting efficiency higher than 0.04. Further, by adjusting the type of the thermal conductive powder, an ultra high heat conducting efficiency can be achieved. Furthermore, the formation of the insulating polymer layer increases the breakdown voltage of the substrate.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A thin metal substrate having high thermal conductivity, comprising:
   a copper foil layer;
   a thermal conductive adhesive layer comprising a resin and a thermal conductive powder dispersed in the resin, wherein the thermal conductive powder has an average particle diameter of 5-20 um, and the thermal conductive powder is made of at least one selected from the group consisting of silicon carbide, boron nitride, aluminum oxide and aluminum nitride; and
   an insulating polymer layer disposed between the copper foil layer and the thermal conductive adhesive layer.

2. The thin metal substrate of claim 1, wherein the thermal conductive powder is 40-90% by weight in a solid content of the thermal conductive adhesive layer.

3. The thin metal substrate of claim 1, wherein the thermal conductive powder has an average particle diameter of 5-20 um, and the thermal conductive powder is made of at least one selected from the group consisting of silicon carbide, boron nitride, aluminum oxide and aluminum nitride.

4. The thin metal substrate of claim 1, wherein the copper foil is an electrodeposited copper foil or a rolled-wrought copper foil.

5. The thin metal substrate of claim 1, wherein the copper foil layer has a thickness of 12.5-70 um, the insulating polymer layer has a thickness of 5-8 um, and the thermal conductive adhesive layer has a thickness of 20-25 um.

6. The thin metal substrate of claim 1, wherein the insulating polymer layer is made of polyimide.

7. The thin metal substrate of claim 1, wherein the resin of the thermal conductive adhesive layer is made of one selected from the group consisting of an epoxy resin, an acrylic resin, a urethane resin, a silicone resin, a poly(p-xylene) resin, a bismaleimide resin and a polyimide resin.

8. The thin metal substrate of claim 1, further comprising a metal layer having a thickness of 0.3-3 um, wherein the thermal conductive adhesive layer is disposed between the insulating polymer layer and the metal layer.

* * * * *